United States Patent
Mikhemar et al.

(10) Patent No.: US 8,918,138 B2
(45) Date of Patent: Dec. 23, 2014

(54) RECEIVE BAND SELECTION AND ELECTROSTATIC DISCHARGE PROTECTION IN A TRANSCEIVER

(75) Inventors: Mohyee Mikhemar, Irvine, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 471 days.

(21) Appl. No.: 12/806,500

(22) Filed: Aug. 13, 2010

(65) Prior Publication Data

US 2012/0040632 A1    Feb. 16, 2012

(51) Int. Cl.
*H04M 1/00* (2006.01)
*H04B 1/18* (2006.01)
*H01L 23/60* (2006.01)

(52) U.S. Cl.
CPC *H04B 1/18* (2013.01); *H01L 23/60* (2013.01); *H01L 2924/0002* (2013.01)
USPC .................................. 455/552.1; 455/553.1

(58) Field of Classification Search
CPC .. G01R 31/3627; G01R 31/3658; H04B 1/16; H04B 1/1607; H04B 1/44; H01H 47/26; H01Q 3/34; H02J 7/0031; H02J 7/0072; H04L 1/02; H04L 25/03847
USPC ............. 455/552.1–553.1, 63.1, 296; 361/56, 361/111
See application file for complete search history.

(56) References Cited

U.S. PATENT DOCUMENTS

| | | | |
|---|---|---|---|
| 5,689,396 A * | 11/1997 | Lee ................................. | 361/111 |
| 5,771,140 A * | 6/1998 | Kim ................................ | 361/111 |
| 5,946,176 A * | 8/1999 | Ghoshal .......................... | 361/56 |
| 6,995,630 B2 * | 2/2006 | Satoh et al. .................... | 333/133 |
| 7,295,814 B2 * | 11/2007 | Yamashita et al. .............. | 455/83 |
| 7,343,137 B2 * | 3/2008 | Block et al. ..................... | 455/78 |
| 7,373,171 B2 * | 5/2008 | Nakai .......................... | 455/552.1 |
| 2005/0047042 A1 * | 3/2005 | Satou et al. .................... | 361/100 |
| 2008/0217656 A1 * | 9/2008 | Huang ............................ | 361/56 |
| 2008/0316660 A1 * | 12/2008 | Huang et al. .................... | 361/56 |
| 2010/0014199 A1 * | 1/2010 | Kawa et al. ..................... | 361/56 |
| 2011/0207409 A1 * | 8/2011 | Ker et al. ...................... | 455/63.1 |
| 2011/0246808 A1 * | 10/2011 | Kerth et al. .................... | 713/340 |
| 2012/0050926 A1 * | 3/2012 | Sofer et al. ..................... | 361/56 |

* cited by examiner

*Primary Examiner* — Lana N Le
(74) *Attorney, Agent, or Firm* — Oblon, Spivak, McClelland, Maier & Neustadt, L.L.P.

(57) ABSTRACT

According to one embodiment, an input control unit to provide isolation and electrostatic discharge (ESD) protection for a circuit in an RF transceiver comprises a switching device coupled between an input of the circuit and ground. The switching device is configured to provide ESD protection while the circuit is activated. The switching device is further configured to ground the input while the circuit is non-activated, thereby concurrently isolating the input and providing ESD protection. A method for providing isolation and ESD protection for a circuit in an RF transceiver comprises activating the circuit, providing ESD protection while the circuit is activated, deactivating the circuit, and coupling an input of the circuit to ground, thereby concurrently isolating the input and providing ESD protection while the circuit is non-activated. The method and switching device can be used to provide isolation and ESD protection to receive bands in the RF transceiver.

13 Claims, 4 Drawing Sheets

RECEIVE BAND SELECTION AND ELECTROSTATIC DISCHARGE PROTECTION IN A TRANSCEIVER

BACKGROUND OF THE INVENTION

1. Field of the Invention

The present invention is generally in the field of electronic circuits and systems. More specifically, the present invention is in the field of communications circuits and systems.

2. Background Art

Transceivers are typically used in communications systems to support transmission and reception of communication signals through a common antenna, for example, at radio frequency (RF) in a cellular telephone or other mobile communication device. Because a receiver implemented in a communications transceiver is typically coupled to the transceiver antenna, the receiver is susceptible to damage or interference caused by an electrostatic discharge (ESD) event. In a conventional receiver, ESD protection is normally provided by a dedicated ESD transistor, such as a field-effect transistor (FET) in which the source, gate, and body terminals are grounded. The presence of a large voltage at the drain terminal of the ESD transistor, indicating the occurrence of an ESD event, can force the ESD transistor into a conductive state so as to shunt the disruptive ESD current relatively harmlessly to ground.

Advances in technology have rendered multi-band receivers more common. For example, more modern receiver chips may support multiple higher frequency receive bands as well as multiple lower frequency receive bands, where each separate band requires a corresponding dedicated low-noise amplifier (LNA) to be connected to external off-chip RF filtering. Multi-band receiver functionality requires a mechanism for band selection, as well as substantial isolation among the respective high and low bands, in addition to ESD protection for each receive band. However, conventional multi-band receiver designs typically lack a coherent approach to addressing the technical challenges posed by ESD events, band selection, and band isolation, often relying instead on an ad hoc approach implementing largely independent solutions to each problem.

Thus, there is a need to overcome the drawbacks and deficiencies in the art by providing a solution capable of selectably isolating transceiver circuit inputs and of concurrently providing ESD protection for the circuit.

SUMMARY OF THE INVENTION

The present invention is directed to receive band selection and electrostatic discharge protection in a transceiver, substantially as shown in and/or described in connection with at least one of the figures, and as set forth more completely in the claims.

DETAILED DESCRIPTION OF THE INVENTION

The present invention is directed to receive band selection and electrostatic discharge protection in a transceiver. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
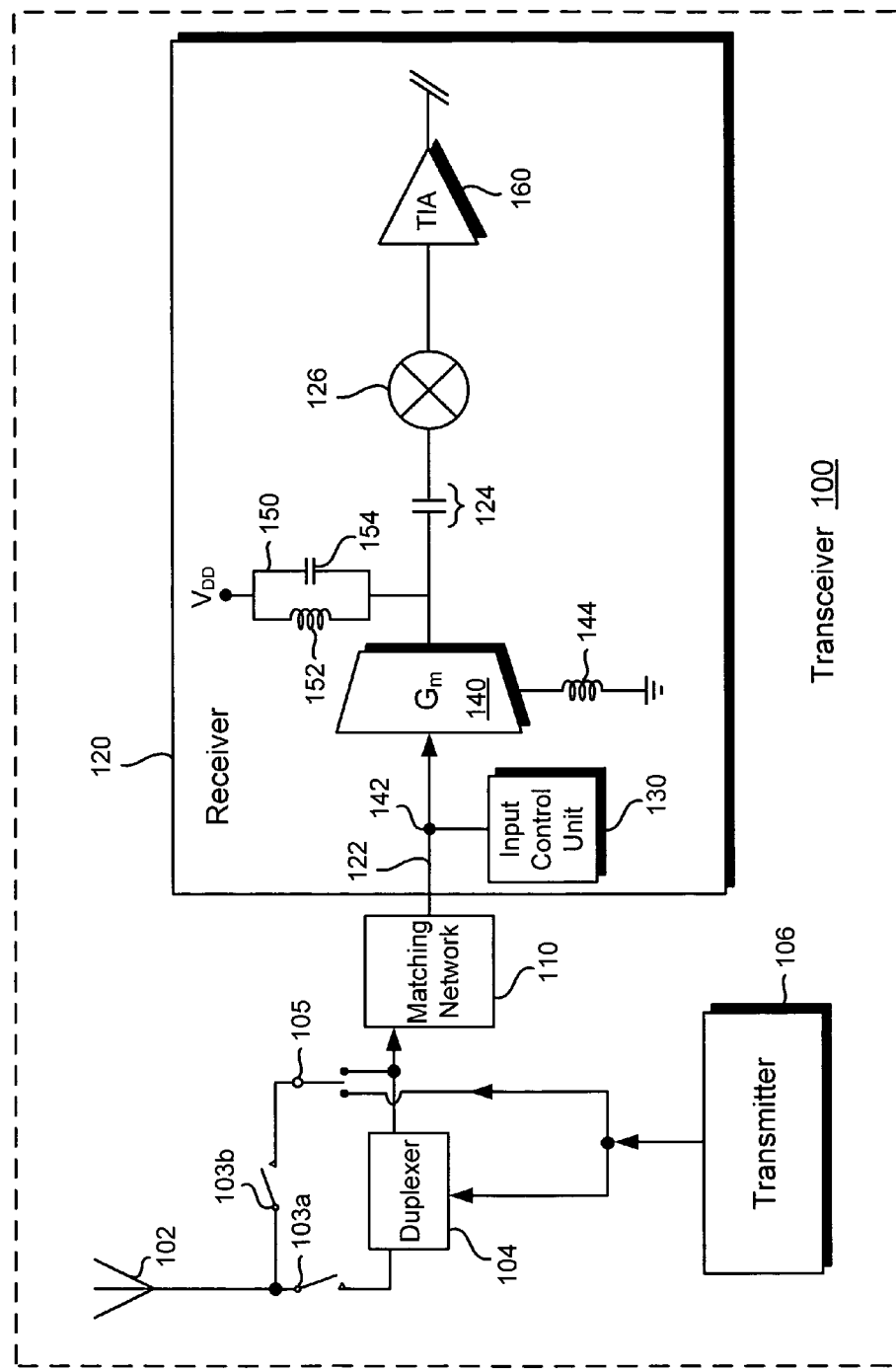
FIG. 1 is a block diagram of a transceiver including a receiver implementing an input control unit providing circuit isolation and electrostatic discharge (ESD) protection, according to one embodiment of the present invention.

FIG. 1 is a block diagram of a transceiver including a receiver implementing an input control unit providing circuit isolation and ESD protection, according to one embodiment of the present invention. As shown in FIG. 1, transceiver 100 comprises antenna 102, transceiver input/output routing switches 103a and 103b, duplexer 104, transmit/receive (TR) switch 105, transmitter 106, receiver matching network 110, and receiver 120. As further shown in FIG. 1, receiver 120 is depicted as supporting a single receive band, e.g., receive band 122. That representation is merely for the purpose of conceptual clarity, however. As will become apparent from FIG. 2, a plurality of input control units, such as input control unit 130, can be implemented in a circuit such as a multi-band receiver supporting a corresponding plurality of receive bands. More generally, the present inventive concepts can be applied to any circuit undergoing selective activation wherein ESD protection is desirable while the circuit is activated and wherein concurrent circuit isolation and ESD protection is desirable while the circuit is in a non-activated state.

Returning to the embodiment if FIG. 1, transceiver 100 includes receiver 120 comprising input control unit 130, transconductance amplifier 140 coupled to ground through inductor 144, tuning circuit 150 including tuning inductor 152 and tuning capacitor 154, blocking capacitor 124, mixer 126, and transimpedance amplifier (TIA) 160. Also present in FIG. 1 is input 142 of transconductance amplifier 140, which is shown to be coupled by input control unit 130. It is noted that the broken line shown to the right of TIA 160 is provided to indicate connection of TIA outputs to other features internal to receiver 120, such as low-pass filters (LPFs), analog-to-digital converters (ADCs), and digital processing blocks to perform back-end receiver processing, as known in the art. Transceiver 100 may be utilized in a cellular telephone or other mobile device communicating at radio frequency (RF), for example, such as in a frequency range from approximately 0.8 GHz to approximately 2.2 GHz.

According to embodiments of the present invention disclosed herein, input control unit 130 is designed to overcome the drawbacks and deficiencies of conventional circuit designs by enabling concurrent band isolation and ESD protection for receive band 122. That is to say, input control unit 130 can be implemented to select and de-select receive band 122 as, respectively an activated and non-activated communication band, to provide ESD protection to band 122 in both its activated and non-activated states, and to isolate input 142 when band 122 is non-activated. Moreover, that multiple functionality is consolidated into a single circuit unit, thereby providing a coherent and physically compact solution to several distinct technical challenges.

Thus, as communications technologies continue to move in the direction of smaller device and circuit dimensions, as represented, for example, by the 40 nm technology node and beyond, the more consolidated circuit architecture disclosed herein is particularly well suited to meet those fine dimensional constraints. In one embodiment, receiver 120 including input control unit 130 may comprise an integrated circuit (IC), fabricated on a single semiconductor die using a 40 nm technology process, for example.

Figure 2:
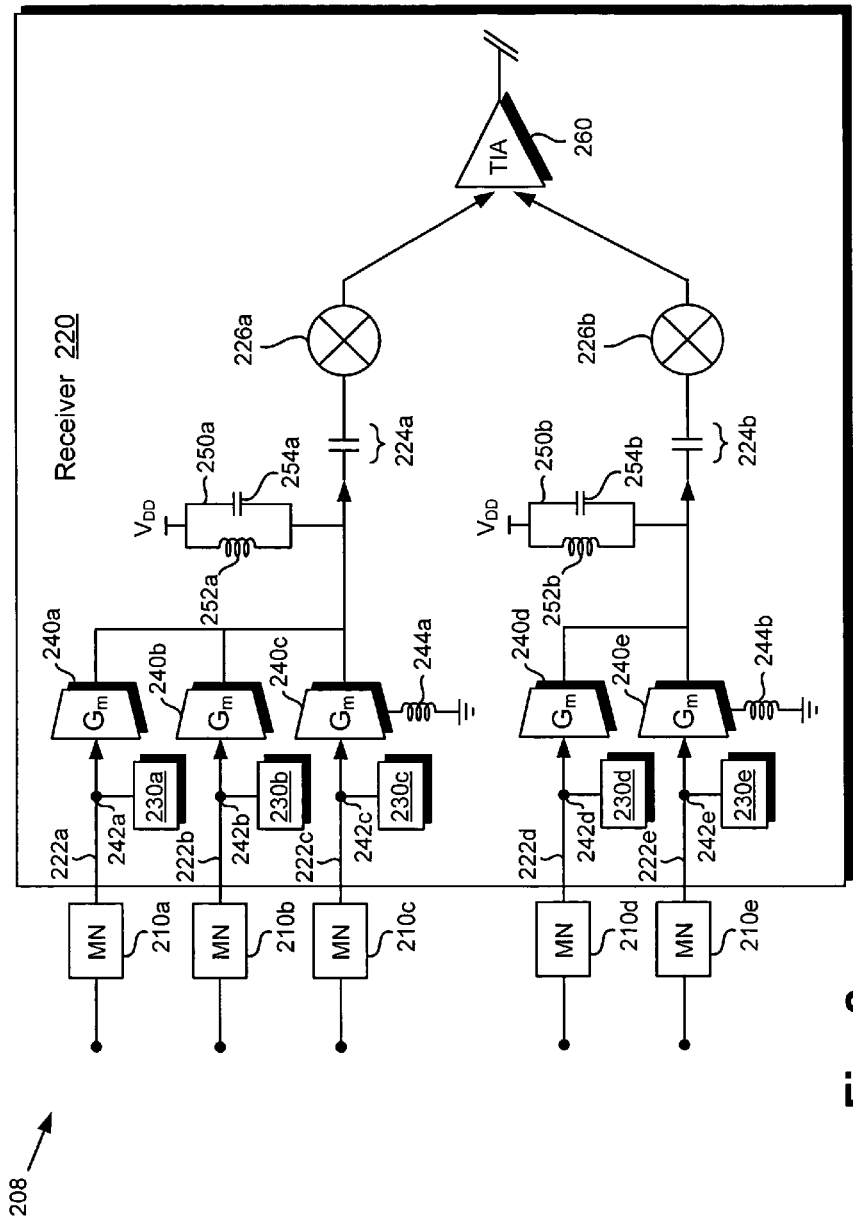
FIG. 2 is a block diagram showing a multi-band receiver implementing a plurality of input control units providing band isolation and ESD protection, according to one embodiment of the present invention.
Figure 3:
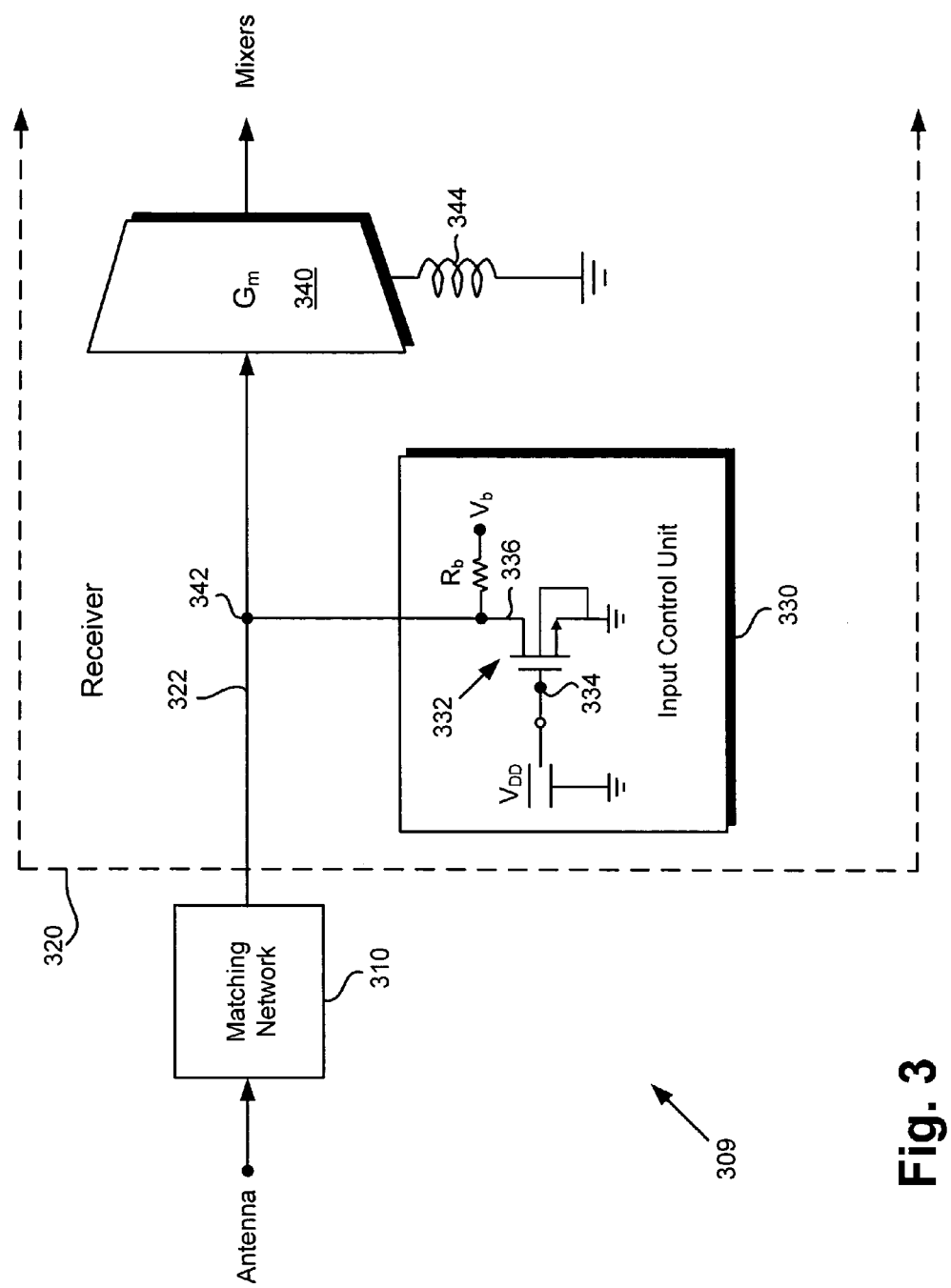
FIG. 3 is a block diagram showing a more detailed embodiment of an input control unit providing circuit isolation and ESD protection in a transceiver.
Figure 4:
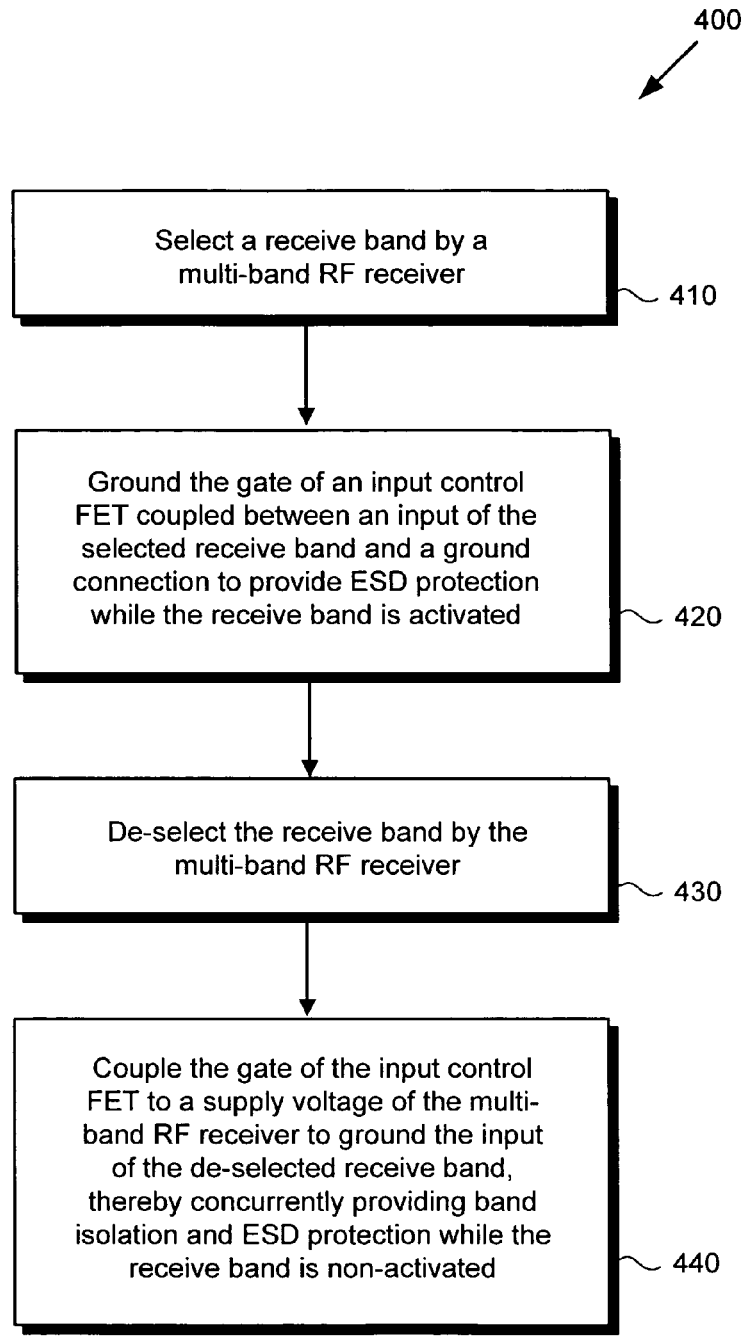
FIG. 4 is a flowchart presenting a method for providing isolation and ESD protection for transceiver circuit, according to one embodiment of the present invention.

The advantages attributable to implementation of input control unit 130 will be further described by reference to FIGS. 2, 3, and 4. FIG. 2 is an example embodiment showing a multi-band receiver implementing a plurality of input control units providing band isolation and ESD protection, while FIG. 3 shows a more detailed embodiment of an input control unit providing circuit isolation and ESD protection according to one embodiment of the present invention. FIG. 4 is a flowchart presenting a method for providing isolation and ESD protection for a circuit, according to one embodiment of the present invention.

Referring to FIG. 2, FIG. 2 shows receiver environment 208 including receiver matching networks 210*a*, 210*b*, 210*c*, 210*d*, and 210*e* (hereinafter matching networks 210*a*-210*e*) and receiver 220, corresponding respectively to receiver matching network 110 and receiver 120, in FIG. 1. Receiver 220 is shown as a multi-band receiver designed to support a plurality of receive bands including higher frequency receive bands 222*a*, 222*b*, and 222*c* (hereinafter receive bands 222*a*-222*c*), and lower frequency receive bands 222*d* and 222*e* (collectively hereinafter receive bands 222*a*-222*e*), any of which may be seen to correspond to receive band 122, in FIG. 1. For example, lower frequency receive bands 222*d* and 222*e* may correspond to a receive signal frequency in a range from approximately 0.8 GHz to approximately 1.0 GHz, while higher frequency receive bands 222*a*-222*c* may correspond to a receive signal frequency in a range from approximately 1.8 GHz to approximately 2.2 GHz.

Receiver 220 includes high-band transconductance amplifiers 240*a*, 240*b*, and 240*c* (hereinafter transconductance amplifiers 240*a*-240*c*) and low-band transconductance amplifiers 240*d* and 240*e* (collectively hereinafter transconductance amplifiers 240*a*-240*e*). Transconductance amplifiers 240*a*-240*e* have respective inputs 242*a*, 242*b*, 242*c*, 242*d*, and 242*e* (hereinafter inputs 242*a*-242*e*), which are shown each to be coupled by one of respective input control units 230*a*, 230*b*, 230*c*, 230*d*, and 230*e* (hereinafter input control units 230*a*-230*e*). As further shown in FIG. 2, high-band transconductance amplifiers 240*a*-240*c* are coupled to ground through shared inductor 244*a*. In addition, the respective outputs of high-band transconductance amplifiers 240*a*-240*c* are coupled together and mutually coupled to TIA 260 through tuning circuit 250*a* including tuning inductor 252*a* and tuning capacitor 254*a*, blocking capacitor 224*a*, and mixer 226*a*.

Analogously, low-band transconductance amplifiers 240*d* and 240*e* are coupled to ground through shared inductor 244*b*. In addition, the respective outputs of low-band transconductance amplifiers 240*d* and 240*e* are coupled together and mutually coupled to TIA 260 through tuning circuit 250*b* including tuning inductor 252*b* and tuning capacitor 254*b*, blocking capacitor 224*b*, and mixer 226*b*. Input control units 230*a*-230*e*, transconductance amplifiers 240*a*-240*e* having inputs 242*a*-242*e*, and inductors 244*a* and 244*b* correspond respectively to input control unit 130, transconductance amplifier 140 having input 142, and inductor 144, in FIG. 1. Moreover, tuning circuits 250*a* and 250*b* including respective tuning inductors 252*a* and 252*b* and tuning capacitors 254*a* and 254*b*, blocking capacitors 224*a* and 224*b*, mixers 226*a* and 226*b*, and TIA 260, in FIG. 2, correspond respectively to tuning circuit 150 including tuning inductor 152 and tuning capacitor 154, blocking capacitor 124, mixer 126, and TIA 160, in FIG. 1.

It is noted that the nodes shown in FIG. 2 to the left of respective matching networks 210*a*-210*e* are provided to indicate selectable coupling of any one of receive bands 222*a*-222*e* to an antenna serving receiver 220, such as antenna 102 in FIG. 1, through a band selection process. It is further noted that the broken line shown to the right of TIA 260 is provided to indicate connection of TIA outputs to other features internal to receiver 220, such as LPFs, ADCs, and digital processing blocks to perform back-end receiver processing, as known in the art. Furthermore, although FIG. 2 depicts a multi-band receiver supporting two lower frequency receive bands and three higher frequency receive bands, that representation is provided by way of example. In other embodiments, a multi-band receiver, such as receiver 220, may be configured to support more, or fewer, than five receive bands, and may assign those receive bands as higher frequency or lower frequency receive bands in varying arrangements, as deemed advantageous or convenient.

According to the embodiment of FIG. 2, input control units 230*a*-230*e* enable concurrent band isolation and ESD protection for receive bands 222*a*-222*e*. For example, input control unit 230*a* can be utilized to select higher frequency receive band 222*a* while concurrently providing higher frequency receive band 222*a* with ESD protection. Selection of higher frequency receive band 222*a* corresponds to non-selection of higher frequency receive bands 222*b* and 222*c*, as well as to non-selection of lower frequency receive bands 222*d* and 222*e*. Consequently, receive bands 222*b*-222*e* remain in a non-activated state and are isolated from activated higher frequency receive band 222*a*, as well as receiving ESD protection, through the operation of respective input control units 230*b*-230*e*.

Where, for instance, the outputs of a plurality of receive band transconductance amplifiers are tied together, such as the outputs of high-band transconductance amplifiers 204*a*-240*c* and the outputs of low-band transconductance amplifiers 240*d* and 240*e*, the band isolation provided by input control units 230*a*-230*e* for non-selected and thus non-activated bands effectively prevents signal leakage from non-selected receive bands sharing a common signal path node with the selected receive band. Thus, in a multi-band receiver design including input control units such as that represented by receiver 220 including input control units 230*a*-230*e*, selection of one of the receive bands results in that selected receive band being concurrently activated and isolated from all other receive bands, while all of the receive bands are provided ESD protection by their respective input control units.

Turning now to FIG. 3, FIG. 3 is a block diagram showing a more detailed embodiment of an input control unit providing circuit isolation and ESD protection. Transceiver environment 309, in FIG. 3, includes receiver matching network 310 and receiver 320 corresponding respectively to receiver matching network 110 and receiver 120, in FIG. 1. Receiver 320 comprises receive band 322 including transconductance amplifier 340 coupled to ground through inductor 344 and having input 342. In addition, Receiver 320 includes input control unit 330 configured to provide band isolation and ESD protection coupled to band 322 at input 342. Receive band 322, input control unit 330, transconductance amplifier 340 having input 342, and inductor 344 correspond respectively to receive band 122, input control unit 130, transconductance amplifier 140 having input 142, and inductor 144, in FIG. 1.

As shown in FIG. 3, example input control unit 330 comprises field-effect transistor (FET) 332, which may be a metal-insulator-semiconductor FET (MISFET) such as a metal-oxide-semiconductor FET (MOSFET), for example, coupled between input 342 and ground. According to the embodiment of FIG. 3, gate 334 of FET 332 can be selectably coupled to the $V_{DD}$ supply voltage of receiver 320 or to ground. It is noted that, although the embodiment of FIG. 3 represents input control unit 330 as comprising FET 332 having gate 334 selectably coupled between $V_{DD}$ and ground, more generally, input control unit 330 may comprise any suitable switching device coupled between input 342 and ground and having a control terminal selectably coupled between a supply voltage, such as $V_{DD}$, and ground. Returning to the specific embodiment of FIG. 3, the source and body of FET 332 are shown to be grounded, while drain 336 of FET 332 is both coupled to input 342 and biased by voltage source $V_b$.

The operation of input control unit 330 will be further described in combination with FIG. 4, which presents flowchart 400 describing one embodiment of a method for providing isolation and ESD protection for a circuit. Certain details and features have been left out of flowchart 400 that are apparent to a person of ordinary skill in the art. For example, a step may comprise one or more substeps or may involve specialized equipment or materials, as known in the art. While steps 410 through 440 indicated in flowchart 400 are sufficient to describe one embodiment of the present invention, other embodiments of the invention may utilize steps different from those shown in flowchart 400, or may comprise more, or fewer, steps.

Step 410 of flowchart 400 comprises selecting a receive band by a multi-band RF receiver. Referring to FIGS. 2 and 3, and bearing in mind that receive band 322 and input control unit 330, in FIG. 3, may be seen to correspond respectively to any of receive bands 222a-222e and their associated input control units 230a-230e, step 410 corresponds to selecting any one of receive bands 222a-222e and maintaining all others in a non-selected state. In it's various embodiments, a transceiver including multi-band receiver 220 and input control units 230a-230e, such as transceiver 100 in FIG. 1, can be implemented in, for example, a wireless communications device, a cellular telephone, a Bluetooth enabled device, a computer, a satellite set-top box, an RF transceiver, a personal digital assistant (PDA), or in any other kind of system, device, component or module utilized as a transceiver in modern electronics applications.

Continuing with step 420 in FIG. 4 and continuing to refer back to FIG. 3, step 420 of flowchart 400 comprises grounding gate 334 of FET 332 coupled between input 342 and ground to provide ESD protection while receive band 322 is activated. According to the embodiment of FIG. 3, step 420 corresponds to selectably coupling gate 334 of FET 332 to ground. For example, selection and activation of receive band 322 results in the following state characteristics of FET 332: gate 334 is selectively coupled to ground, source and body terminals are grounded, drain terminal 336 is coupled to activated receive band 322 at input 342 and is biased by voltage $V_b$ through resistor $R_b$.

Thus, activation of receive band 322 corresponds to the control terminal of FET 332, e.g., gate 334 being coupled to ground. Moreover, receive band 322 being activated causes FET 332 to be placed in a nominally non-conductive quiescent state. As may be seen from FIG. 3, that nominally non-conductive quiescent state of FET 332 during activation of receive band 322 enables input control unit 330 to provide ESD protection for receive band 322 while receive band 322 is activated.

Moving to step 430 of FIG. 4 and continuing to refer to transceiver environment 309, in FIG. 3, step 430 of flowchart 400 comprises de-selecting receive band 322 by multi-band receiver 320. De-selection of receive band 322, in step 430 of flowchart 400, results in receive band 322 being placed in a non-activated state. Referring to step 440 of flowchart 400, deactivation of receive band 322 corresponds to gate 324 of FET 322 being selectably coupled to supply voltage $V_{DD}$ of multi-band receiver 320. As can be seen from FIG. 3, coupling gate 334 of FET 332 to $V_{DD}$ renders FET 332 conductive, resulting in input 342. As may be further recognized by reference to the embodiment of input control unit 330 shown in FIG. 3, grounding input 342 through FET 332 concurrently isolates receive band 322 and provides ESD protection to receive band 332.

According to the embodiment shown in FIG. 3, gate 334 being selectably coupled to supply voltage $V_{DD}$ corresponds to receive band 322 being in a non-activated state, through either not having been selected or through de-selection after activation. Conversely, gate 334 being selectably coupled to ground corresponds to receive band 322 being in an activated state as a result of having been selected as a receive band by multi-band receiver 320. Moreover, referring to FIG. 2, because it is contemplated that only one of receive bands 222a-222e will be in an activated state at any one time, such as receive band 222a for example, receive bands 222b-222e are typically in a non-activated state while receive band 222a is activated. Consequently, the embodiment of input control unit 330 represented in FIG. 3 results in the inputs 242b-242e of receive bands 222b-222e being grounded while receive band 222a is activated, thereby providing effective isolation of each receive band so as to prevent undesirable signal leakage from any non-selected receive band.

Thus, by providing an input control unit including a selectably controlled switching device coupled between a circuit input and ground, the present application discloses a solution enabling concurrent provision of circuit isolation and ESD protection. For example, by placing the switching device in a nominally non-conductive state during activation of the circuit, embodiments of the present invention ensure ESD protection during circuit activation without interfering with desired circuit operation. In addition, by rendering the switching device conductive during non-activation of the circuit, embodiments of the present application maintain ESD protection while the circuit is in a non-activated state, while concurrently isolating the circuit input.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A radio frequency (RF) receiver comprising:
 a plurality of receive bands each having an input selectably coupled to an antenna; and
 circuitry being coupled between said input and ground for each of the plurality of receive bands, and having a control terminal that is selectably coupled to a supply voltage or to ground for each of the plurality of receive bands,
 wherein the circuitry is configured to:
  activate an input of one of the plurality of receive bands by selectively grounding a control terminal related to the activated receive band; and
  deactivate the remaining receive bands by selectively coupling the remaining control terminals to the supply voltage so as to couple the input of the remaining receive bands to ground, thereby providing band isolation and electrostatic discharge (ESD) protection to the plurality of receive bands.

2. The RF receiver of claim 1, wherein said supply voltage is provided by a positive power rail of said RF receiver.

3. The RF receiver of claim 1, wherein said remaining control terminals coupled to said supply voltage correspond to said remaining receive bands being non-activated, and
 said control terminal coupled to ground corresponds to said one receive band being activated.

4. The RF receiver of claim 1, wherein the circuitry is biased so as to maintain a nominally non-conductive quiescent state when said one receive band is activated.

5. The RF receiver of claim 1, wherein said circuitry includes a field-effect transistor (FET).

6. The RF receiver of claim 1, wherein said RF receiver is part of a radio frequency transceiver implemented in a mobile communication device.

7. The RF receiver of claim 1, further comprising:
 a plurality of transconductance amplifiers are each coupled to one of the inputs.

8. A method for utilizing a radio frequency (RF) receiver that includes a plurality of receive bands each having an input selectably coupled to an antenna, and circuitry being coupled between said input and ground for each of the plurality of receive bands, and having a control terminal that is selectably coupled to a supply voltage or to ground for each of the plurality of receive bands, the method comprising:
 activating, by the circuitry, an input of one of the plurality of receive bands by selectively grounding a control terminal related to the activated receive band; and
 deactivating, by the circuitry, the remaining receive bands by selectively coupling the remaining control terminals to the supply voltage so as to couple the input of the remaining receive bands to ground, thereby providing band isolation and electrostatic discharge (ESD) protection to the plurality of receive bands.

9. The method of claim 8, wherein said supply voltage is provided by a positive power rail of said RF receiver.

10. The method of claim 8, wherein said remaining control terminals coupled to said supply voltage correspond to said remaining receive bands being non-activated, and
 said control terminal coupled to ground corresponds to said one receive band being activated.

11. The method of claim 8, wherein the circuitry is biased so as to maintain a nominally non-conductive quiescent state when said one receive band is activated.

12. The method of claim 8, wherein said circuitry includes a field-effect transistor (FET).

13. The method of claim 8, wherein said RF receiver is part of a radio frequency transceiver implemented in a mobile communication device.

* * * * *